(12) United States Patent
Cheng (10) Patent No.: US 12,396,193 B2
(45) Date of Patent: Aug. 19, 2025

(54) SEMICONDUCTOR STRUCTURE AND PREPARATION METHOD THEREFOR

(71) Applicant: ENKRIS SEMICONDUCTOR, INC., Suzhou (CN)

(72) Inventor: Kai Cheng, Suzhou (CN)

(73) Assignee: ENKRIS SEMICONDUCTOR, INC., Suzhou (CN)

( * ) Notice: Subject to any disclaimer, the term of this patent is extended or adjusted under 35 U.S.C. 154(b) by 452 days.

(21) Appl. No.: 17/510,558

(22) Filed: Oct. 26, 2021

(65) Prior Publication Data

US 2022/0052191 A1 Feb. 17, 2022

Related U.S. Application Data

(63) Continuation of application No. PCT/CN2019/084603, filed on Apr. 26, 2019.

(51) Int. Cl.
*H10D 30/47* (2025.01)
*H10D 30/01* (2025.01)
*H10D 62/85* (2025.01)

(52) U.S. Cl.
CPC ........... *H10D 30/47* (2025.01); *H10D 30/015* (2025.01); *H10D 62/8503* (2025.01)

(58) Field of Classification Search
CPC ............. H01L 29/432; H01L 29/66462; H01L 29/778; H01L 29/7786; H10D 62/343; H10D 30/47; H10D 30/015
See application file for complete search history.

(56) References Cited

U.S. PATENT DOCUMENTS

| 5,111,255 A | * | 5/1992 | Kiely | .................. H01L 29/7783 257/E29.05 |
| 7,033,961 B1 | * | 4/2006 | Smart | ............... H01L 29/66462 257/E29.253 |
| 2007/0018199 A1 | * | 1/2007 | Sheppard | .......... H01L 29/66462 257/E29.127 |

(Continued)

FOREIGN PATENT DOCUMENTS

CN 102709319 A 10/2012
CN 103035700 A 4/2013
(Continued)

OTHER PUBLICATIONS

International Search Report issued in corresponding PCT Application No. PCT/CN2019/084603, dated Jan. 23, 2020.
(Continued)

*Primary Examiner* — Evren Seven
(74) *Attorney, Agent, or Firm* — Westbridge IP LLC (57) ABSTRACT

Disclosed are a semiconductor structure and a preparation method therefor. The semiconductor structure includes: a substrate, a channel layer, a barrier layer, a gate structure, a source, and a drain, where the gate structure includes a p-type semiconductor layer, an n-type semiconductor layer, and a gate. In this way, a control capability of a gate to a channel is improved; a threshold voltage of a semiconductor device is improved, avoiding vertical electric leakage of a gate structure, and reducing side electric leakage of the gate structure; and channel degradation is avoided, improving overall output characteristics of the device.

14 Claims, 13 Drawing Sheets

(56) References Cited

U.S. PATENT DOCUMENTS

| | | | |
|---|---|---|---|
| 2008/0296618 A1* | 12/2008 | Suh | H10D 62/343 |
| | | | 257/190 |
| 2013/0083567 A1* | 4/2013 | Imada | H01L 29/66462 |
| | | | 257/192 |
| 2013/0292690 A1* | 11/2013 | Ando | H01L 29/778 |
| | | | 438/172 |
| 2014/0346523 A1 | 11/2014 | Chang et al. | |
| 2015/0034906 A1* | 2/2015 | Xiao | H01L 29/7783 |
| | | | 438/285 |
| 2015/0053992 A1 | 2/2015 | Liu et al. | |
| 2015/0263104 A1* | 9/2015 | Saito | H01L 29/7786 |
| | | | 257/76 |
| 2017/0077280 A1* | 3/2017 | Furukawa | H01L 29/7787 |
| 2017/0365671 A1 | 12/2017 | Nakano et al. | |
| 2021/0265477 A1* | 8/2021 | Lu | H01L 29/778 |
| 2021/0336045 A1* | 10/2021 | Oh | H01L 29/10 |

FOREIGN PATENT DOCUMENTS

| | | |
|---|---|---|
| CN | 104916682 A | 9/2015 |
| CN | 106298907 A | 1/2017 |

OTHER PUBLICATIONS

Written Opinion issued in corresponding PCT Application No. PCT/CN2019/084603, dated Jan. 23, 2020.

\* cited by examiner

SEMICONDUCTOR STRUCTURE AND PREPARATION METHOD THEREFOR

CROSS-REFERENCE TO RELATED APPLICATIONS

The present application is a continuation of International Application No. PCT/CN2019/084603, filed on Apr. 26, 2019, which is incorporated herein by reference in its entirety.

TECHNICAL FIELD

The application relates to the field of semiconductors, and specifically, to a semiconductor structure and a preparation method therefor.

BACKGROUND

As a third-generation semiconductor material, gallium nitride has characteristics of large band gap, high electron saturation speed, high two-dimensional electron gas concentration, and the like, thereby being considered an excellent material for preparation of semiconductor devices, especially the AlGaN/GaN heterojunction structure, which is widely applied to GaN-based electronic devices.

In order to make GaN-based electronic devices more suitable for high-temperature, high-voltage, high-frequency and high-power fields, currently major methods are as follows. First, a groove is etched under a gate to improve the gate control capability. However, in this method, it is difficult to control the etching accuracy, and an output current is reduced, affecting the gain of a device. Second, a dielectric layer is introduced under a gate to reduce electric leakage. However, in this method, as the size of a device decreases in proportion, thinning of the dielectric layer makes the gate control capability increasingly weak, causing more serious electric leakage. Third, a passivation layer is introduced to suppress current collapse. However, in this method, thickness of the passivation layer is difficult to control, and a passivation layer that is too thick introduces parasitic capacitance, resulting in degradation of frequency characteristics of a device.

SUMMARY

In view of this, the application provides a semiconductor structure and a preparation method therefor, which can increase a threshold voltage of a device, greatly reduce gate leakage, and improve output characteristics of the device and a control capability of a gate to a channel.

An embodiment of this application provides a semiconductor structure, including:
a substrate;
a channel layer and a barrier layer sequentially disposed on the substrate; and
a gate structure disposed on the barrier layer, where the gate structure includes a p-type semiconductor layer disposed on the barrier layer, an n-type semiconductor layer disposed on the p-type semiconductor layer, and a gate disposed on the n-type semiconductor layer, where the gate penetrates the n-type semiconductor layer, and a bottom of the gate is in contact with the p-type semiconductor layer.

Further, the gate structure further includes a cap layer disposed between the p-type semiconductor layer and the barrier layer.

Further, the semiconductor structure further includes: a nucleation layer and a buffer layer that are disposed between the substrate and the channel layer.

Further, the semiconductor structure further includes: a source and a drain respectively located on two sides of the gate structure.

An embodiment of this application further provides a preparation method for a semiconductor structure, including:
providing a substrate;
sequentially growing a channel layer and a barrier layer on the substrate in a superimposed manner; and
preparing a gate structure on the barrier layer, where the gate structure includes a p-type semiconductor layer disposed on the barrier layer, an n-type semiconductor layer disposed on the p-type semiconductor layer, and a gate disposed on the n-type semiconductor layer, where the gate penetrates the n-type semiconductor layer, and a bottom of the gate is in contact with the p-type semiconductor layer.

Further, a preparation process of the gate structure includes:
growing the p-type semiconductor layer on the barrier layer;
epitaxially growing the n-type semiconductor layer selectively on the p-type semiconductor layer, so that a groove is reserved in the middle of the n-type semiconductor layer, and the groove penetrates the n-type semiconductor layer;
forming the gate in the groove; and
etching the p-type semiconductor layer and the n-type semiconductor layer that are on two sides of the gate to form the gate structure.

Further, a preparation process of the gate structure may further include:
growing the p-type semiconductor layer and the n-type semiconductor layer on the barrier layer;
starting etching of a groove from one side of the n-type semiconductor layer away from the p-type semiconductor layer, where the groove completely penetrates the n-type semiconductor layer and stops at the p-type semiconductor layer, or the groove completely penetrates the n-type semiconductor layer and partially penetrates the p-type semiconductor layer;
forming a gate in the groove; and
etching the p-type semiconductor layer and the n-type semiconductor layer that are on two sides of the gate to form the gate structure.

Further, a preparation process of the gate structure further includes:
growing the p-type semiconductor layer, the n-type semiconductor layer, and a mask layer on the barrier layer;
starting etching of a groove from one side of the mask layer away from the n-type semiconductor layer, where the groove completely penetrates the mask layer and the n-type semiconductor layer and stops at the p-type semiconductor layer, or completely penetrates the mask layer and the n-type semiconductor layer and partially penetrates the p-type semiconductor layer;
removing the mask layer;
forming the gate in the groove; and
etching the p-type semiconductor layer and the n-type semiconductor layer that are on two sides of the gate to form the gate structure.

Further, the gate structure further includes a cap layer formed between the p-type semiconductor layer and the barrier layer.

Further, the preparation method for a semiconductor structure further includes: forming a nucleation layer and a buffer layer between the substrate and the channel layer.

Further, the preparation method for a semiconductor structure further includes: preparing a source and a drain respectively on two sides of the gate structure.

According to the semiconductor structure and the preparation method therefor provided in the application, a self-aligning process is adopted to improve a control capability of a gate to a channel; and a threshold voltage of a device is increased by using the overall gate structure, and gate leakage is greatly reduced, improving output characteristics of the device and the control capability of the gate to the channel.

To make the foregoing and other objectives, features, and advantages of the application more obvious and understandable, the following describes optional embodiments below in detail in combination with the accompanying drawings.

BRIEF DESCRIPTION OF DRAWINGS

To describe the technical solutions in the embodiments of the application or the prior art more clearly, the following briefly describes the accompanying drawings required for describing the embodiments. Apparently, the accompanying drawings in the following description show merely some embodiments of the application, and a person of ordinary skill in the art may derive other drawings from these accompanying drawings without creative efforts. The foregoing and other objectives, features and advantages of the application will become more apparent with reference to the accompany drawings. The identical reference signs indicate the identical parts in all accompany drawings. The drawings are not deliberately scaled and drawn according to an actual size and are mainly used to show the gist of the application.

DETAILED DESCRIPTION

The technical solutions in the embodiments of the application will be clearly and completely described as below with reference to the accompanying drawings in the embodiments of the application. Apparently, the embodiments described below are merely some but not all of the embodiments of the application. All other embodiments obtained by a person of ordinary skill in the art based on the embodiments of the application without paying any creative effort shall fall into the protection scope of the application.

It should be noted that similar reference signs and letters indicate similar items in the following drawings. Therefore, once a certain item is defined in one drawing, it does not need to be further defined and explained in the subsequent drawings. In addition, in description of the application, the terms "first", "second" and the like are merely intended for a purpose of description and shall not be understood as an indication or implication of relative importance. In the description of the embodiments of the application, it will be understood that when a layer (or film), region, pattern or structure is referred to as being "on" or "under" another substrate, another layer (or film), another region, another pad or another pattern, it may be "directly" or "indirectly" on or under another substrate, layer (or film), region, pad, or pattern, or there may be one or more intermediate layers. The position relationship of the layers has been described with reference to the drawings. For convenience or clarity, the thickness and size of each layer shown in the drawings may be enlarged, omitted, or schematically drawn. In addition, a size of an element does not fully reflect an actual size.

An embodiment of this application provides a preparation method for a semiconductor structure, including the following steps.

Figure 1A:
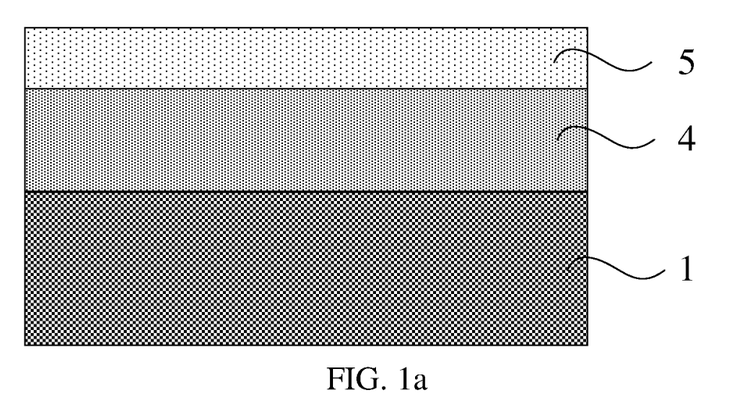
FIG. 1a-FIG. 1b, FIG. 2a-FIG. 2c, FIG. 3a-FIG. 3d, FIG. 4a-FIG. 4d, FIG. 5a-FIG. 5e, FIG. 6 and FIG. 9-FIG. 11 show steps of a preparation method for a semiconductor structure according to the application.

At the first step, as shown in FIG. 1a, providing a substrate 1, and sequentially growing a channel layer 4 and a barrier layer 5 on the substrate 1 in a superimposed manner.

The substrate 1 may be made of semiconductor material, ceramic material, polymer material, or the like. In this embodiment, the substrate 1 is preferably made of sapphire, silicon carbide, silicon, lithium niobate, silicon-on-insulator (SOI), nitrogen gallium nitride, or aluminum nitride.

The channel layer 4 and the barrier layer 5 are made of a GaN-based material. The GaN-based material is semiconductor material including at least a Ga atom and an N atom, for example, GaN, AlGaN, InGaN, or AlInGaN. In this embodiment, the channel layer 4 may be made of GaN, and the barrier layer 5 may be made of AlGaN. The channel layer 4 and the barrier layer 5 form a heterojunction, and a two-dimensional electron gas is formed at an interface of the heterojunction.

Figure 1B:
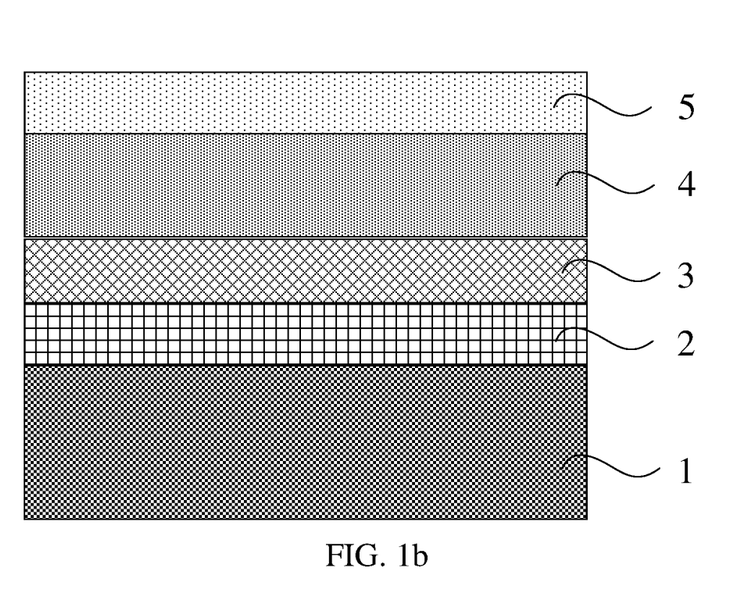

Further, the preparation method for a semiconductor structure further includes: forming a nucleation layer 2 and a buffer layer 3 between the substrate 1 and the channel layer 4, as shown in FIG. 1b. A GaN-based semiconductor is used as an example. To reduce dislocation density and defect density, improve crystal quality and other technical requirements, the method may further include forming a nucleation layer 2 on the substrate 1. The nucleation layer 2 may be made of one or more of AN, AlGaN, and GaN. In addition, to buffer stress in an epitaxial structure above the substrate and prevent the epitaxial structure from cracking, the GaN-based semiconductor structure may further include a buffer layer 22 formed on the nucleation layer 21. The buffer layer 22 may be made of one or more of GaN, AlGaN and AlInGaN.

Figure 2A:
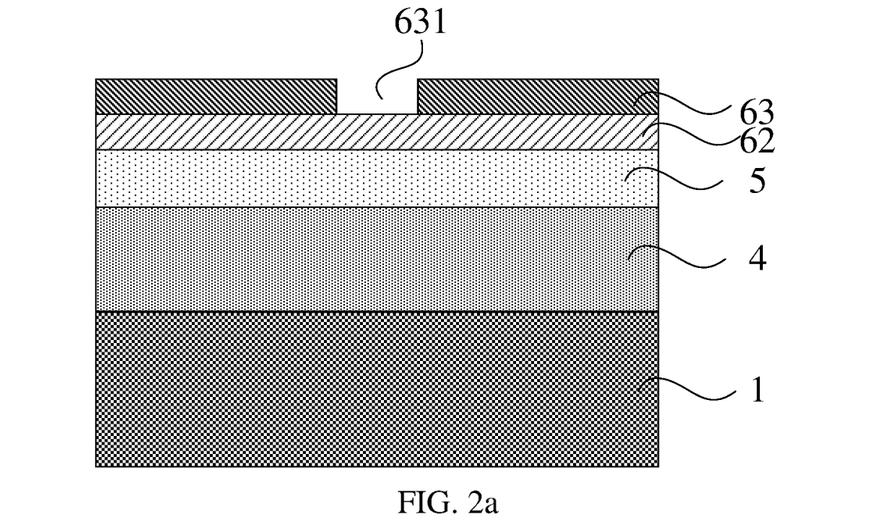
Figure 2B:
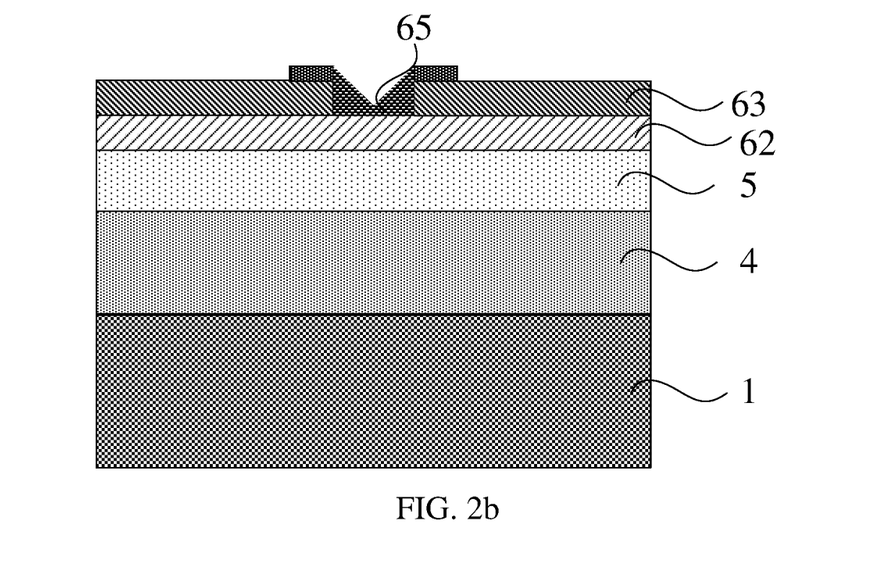
Figure 2C:
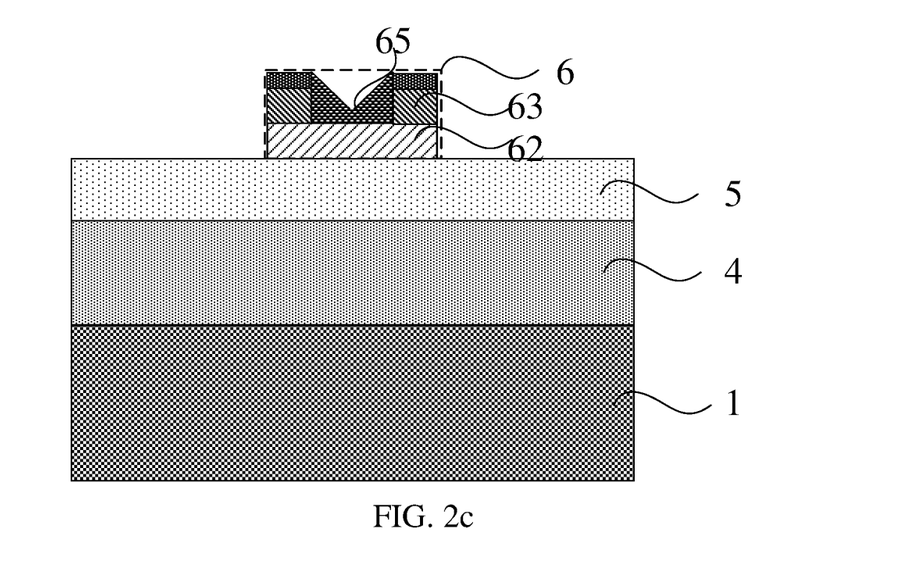

At the second step, as shown in FIG. 2c, preparing a gate structure 6 on the barrier layer 5, where the gate structure 6 includes a p-type semiconductor layer 62 disposed on the barrier layer 5, an n-type semiconductor layer 63 disposed on the p-type semiconductor layer, and a gate 65 disposed on the n-type semiconductor layer, where the gate 65 penetrates the n-type semiconductor layer 63, and a bottom of the gate 65 is in contact with the p-type semiconductor layer. It may be understood that the bottom of the gate 65 may be directly in contact with an upper surface of the p-type semiconductor layer; or the gate 65 may partially penetrate the p-type semiconductor layer to implement the bottom of the gate 65 in contact with the p-type semiconductor layer.

In an embodiment of the application, a preparation process of the gate structure 6 includes the following steps S1-S4.

Figure 9:
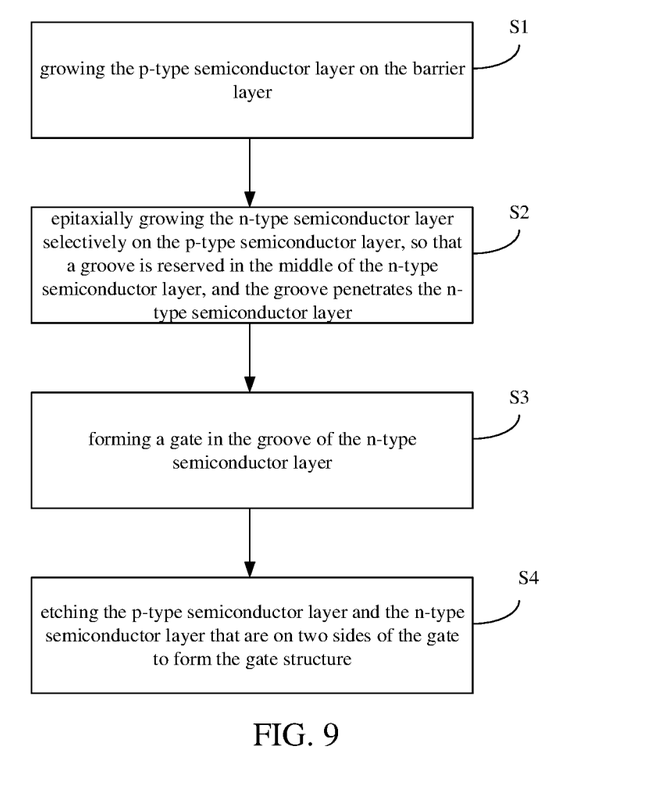

Step S1: as shown in FIG. 2a and FIG. 9, growing the p-type semiconductor layer 62 on the barrier layer 5.

Step S2: as shown in FIG. 2a and FIG. 9, epitaxially growing the n-type semiconductor layer 63 selectively on the p-type semiconductor layer 62, so that a groove 631 is reserved in the middle of the n-type semiconductor layer 63, and the groove 631 penetrates the n-type semiconductor layer 63;

Step S3: as shown in FIG. 2b and FIG. 9, forming a gate 65 in the groove 631 of the n-type semiconductor layer 63; and Step S4: as shown in FIG. 2c and FIG. 9, etching the p-type semiconductor layer 62 and the n-type semiconductor layer 63 that are on two sides of the gate 65 to form the gate structure 6. The dashed frame in FIG. 2c is the entire gate structure 6.

In another embodiment of the application, a preparation process of the gate structure 6 may include the following steps S11-S14.

Figure 3A:
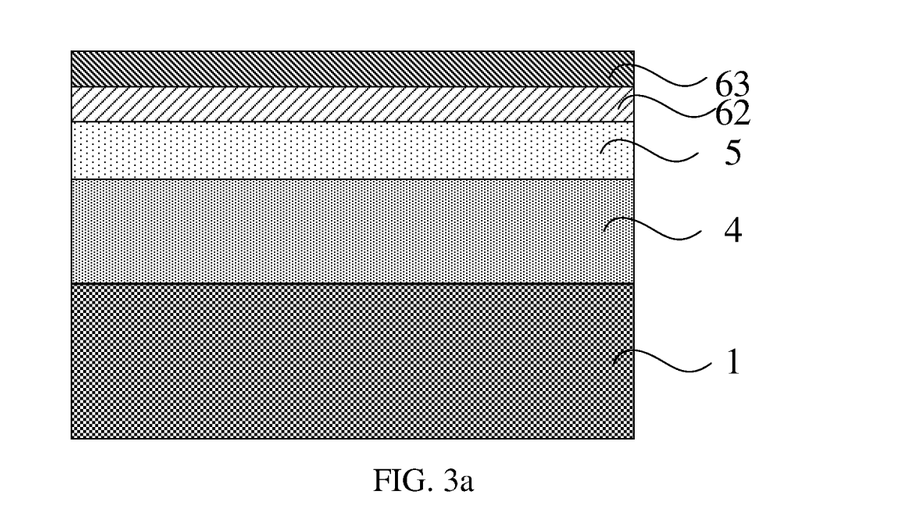
Figure 3B:
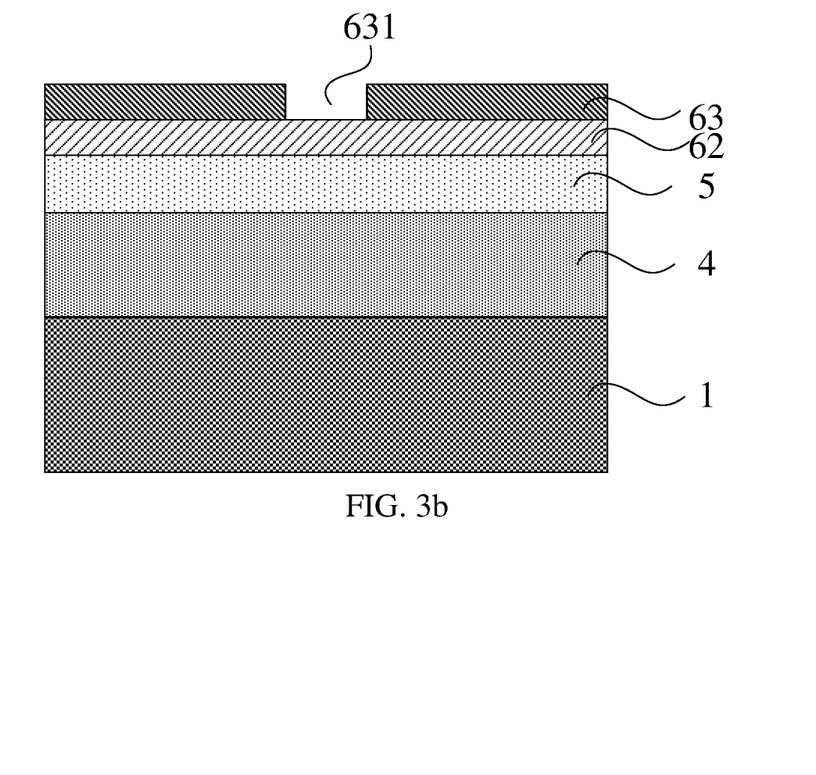
Figure 3C:
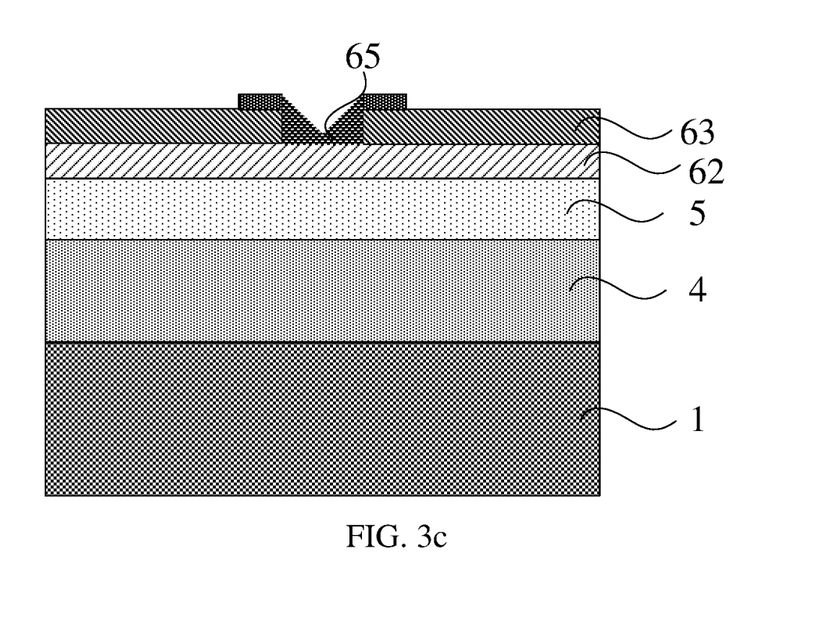
Figure 3D:
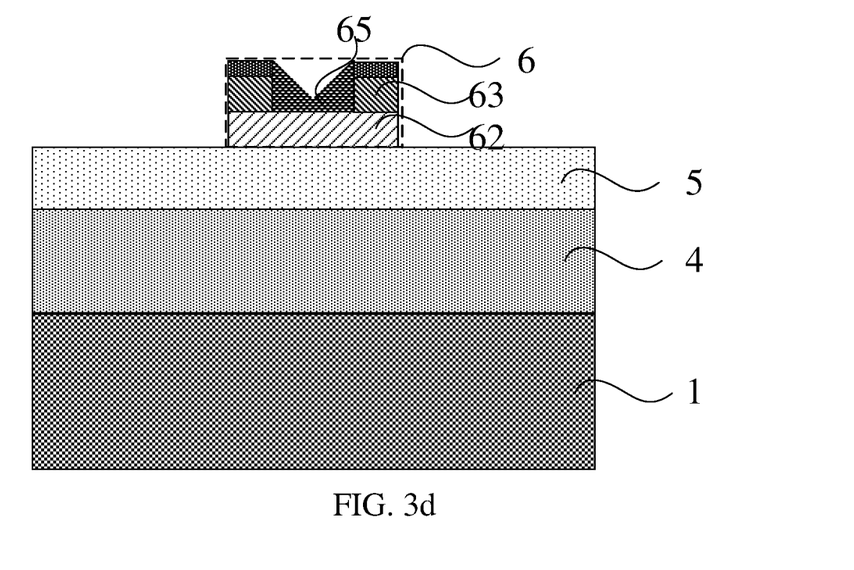
Figure 4A:
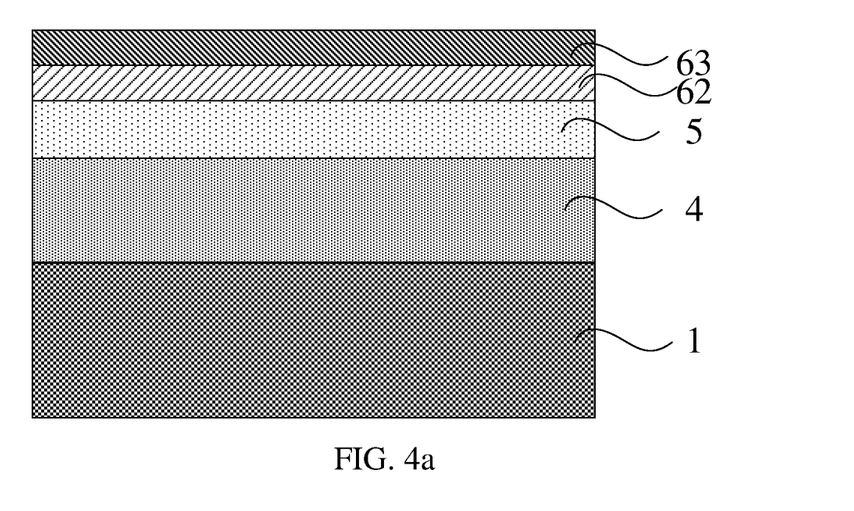
Figure 4B:
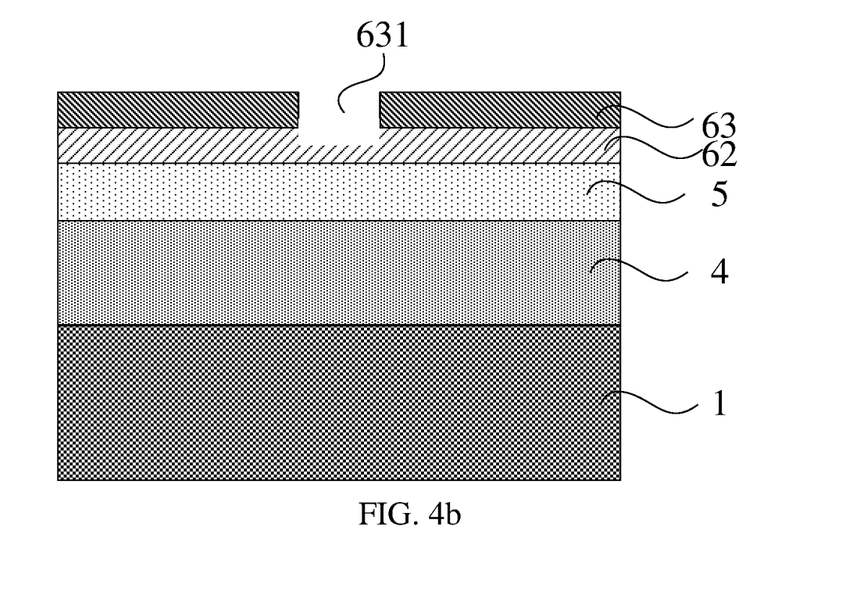
Figure 4C:
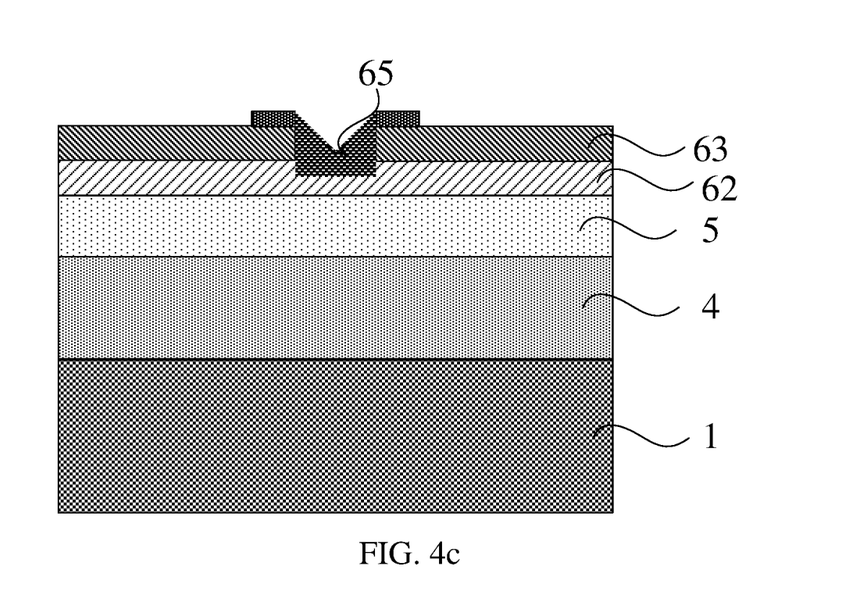
Figure 4D:
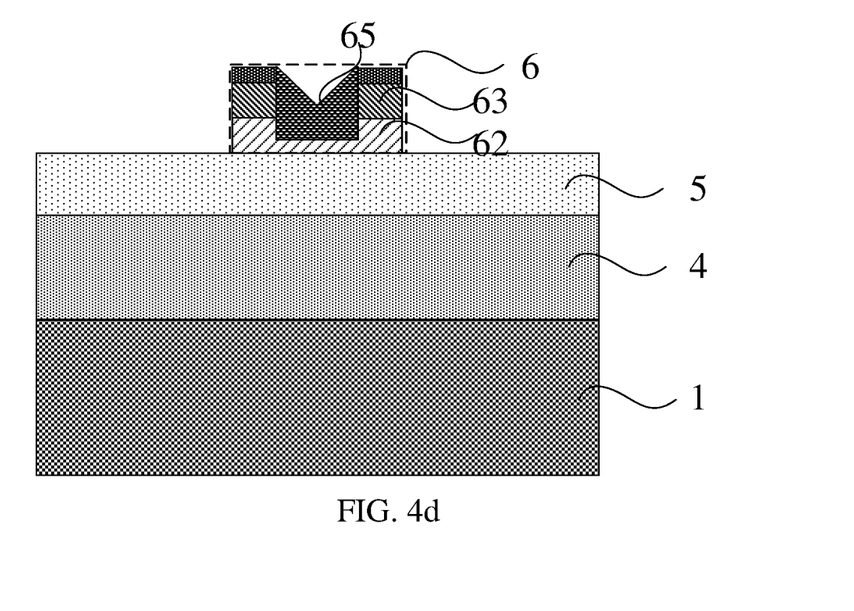
Figure 10:
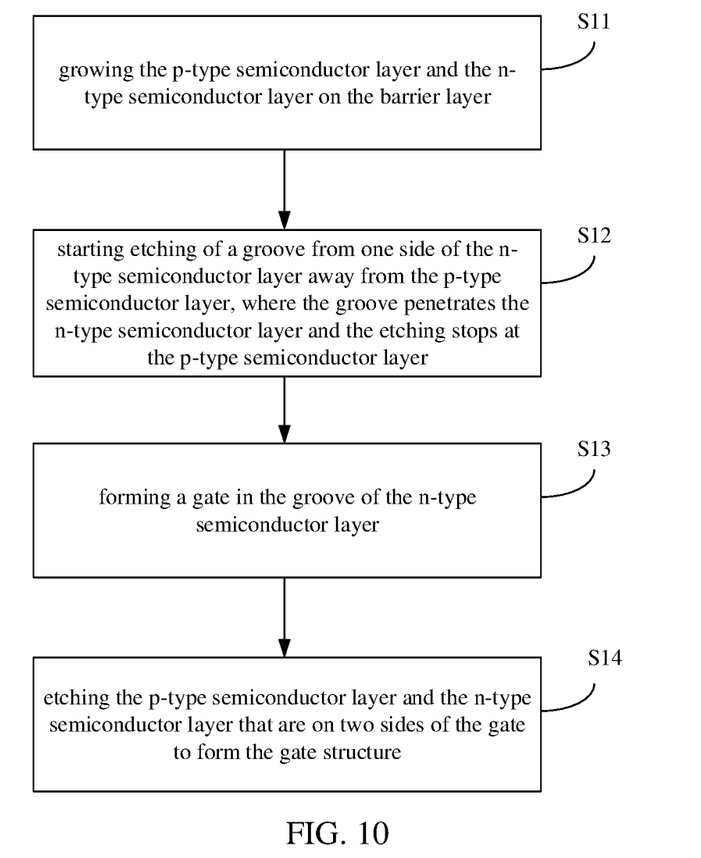
Figure 11:
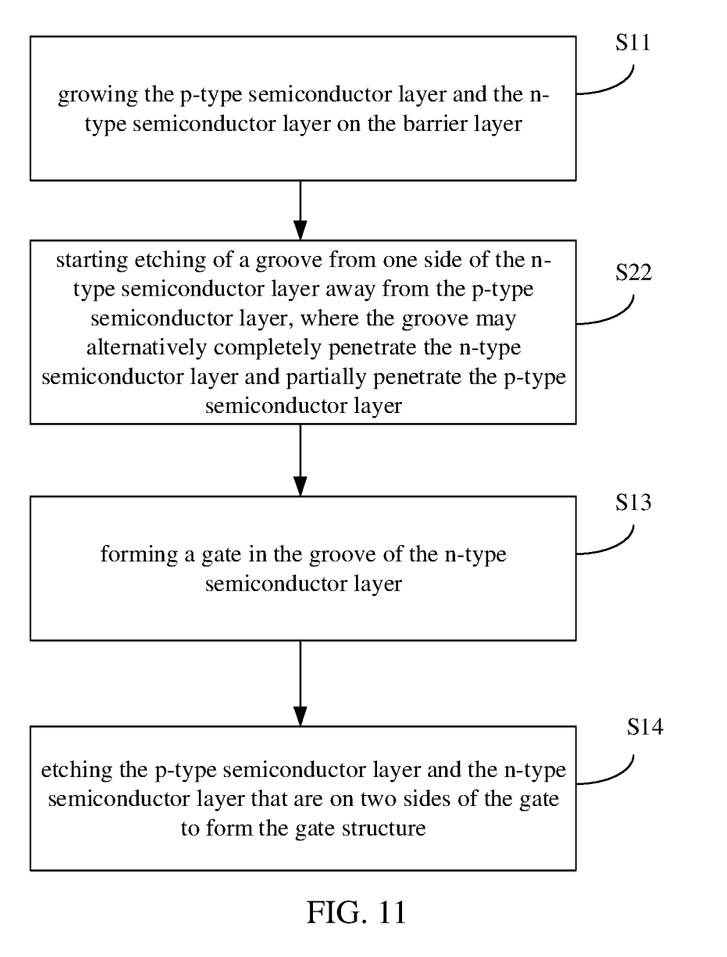

Step S11: as shown in FIG. 3a and FIG. 10, growing the p-type semiconductor layer 62 and the n-type semiconductor layer 63 on the barrier layer 5;

Step S12: as shown in FIG. 3b and FIG. 10, starting etching of a groove 631 from one side of the n-type semiconductor layer 63 away from the p-type semiconductor layer 62, where the groove 631 penetrates the n-type semiconductor layer 63 and the etching stops at the p-type semiconductor layer 62;

Step S13: as shown in FIG. 3c and FIG. 10, forming a gate 65 in the groove 631 of the n-type semiconductor layer 63; and Step S14: as shown in FIG. 3d and FIG. 10, etching the p-type semiconductor layer 62 and the n-type semiconductor layer 63 that are on two sides of the gate 65 to form the gate structure 6.

In this embodiment, the step S12 may be replaced by a step S22 in which the groove 631 may alternatively completely penetrate the n-type semiconductor layer 63 and partially penetrate the p-type semiconductor layer, and other steps S11, S13 and S14 remain the same. The preparation process of the gate structure 6 in this embodiment are as shown in FIG. 4a to FIG. 4d, and FIG. 11.

Further, in another embodiment of the application, a mask layer may alternatively be used to etch the n-type semiconductor, to avoid damage to the n-type semiconductor by direct etching. Details are as follows.

Figure 5A:
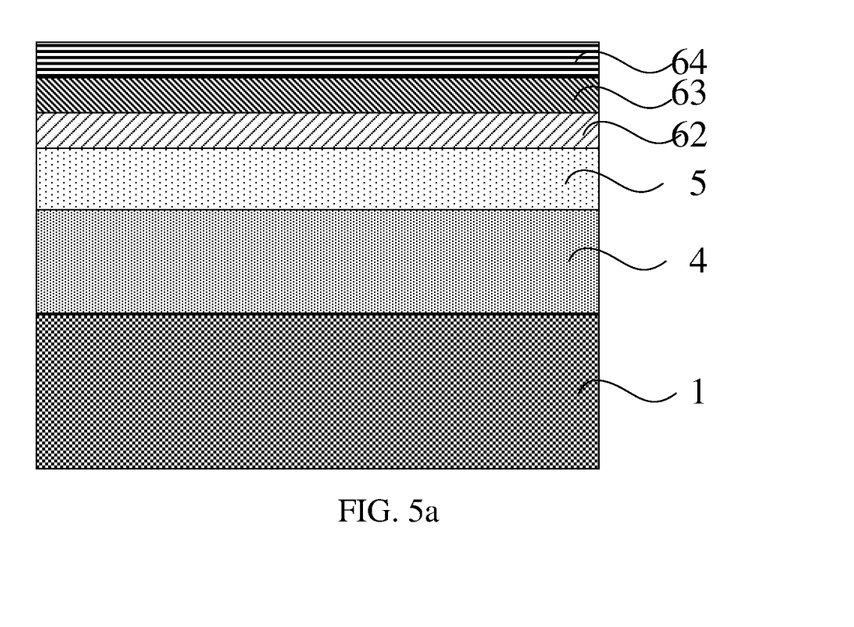

As shown in FIG. 5a, before step S12, a mask layer 64 is formed on the n-type semiconductor layer 63.

Figure 5B:
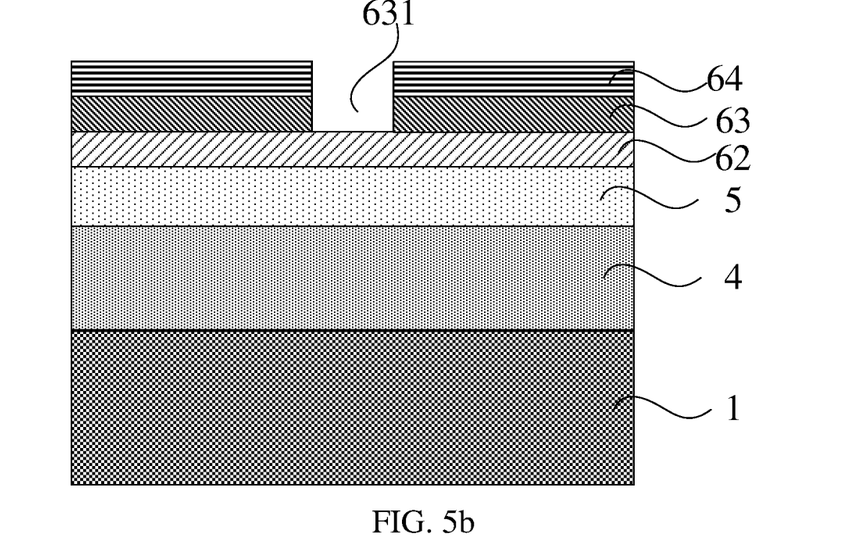

As shown in FIG. 5b, etching of a groove 631 starts from one side of the mask layer 64 away from the n-type semiconductor layer 63, where the groove completely penetrates the mask layer and the n-type semiconductor layer and stops at the p-type semiconductor layer, or completely penetrates the mask layer and the n-type semiconductor layer, and partially penetrates the p-type semiconductor layer.

Figure 5C:
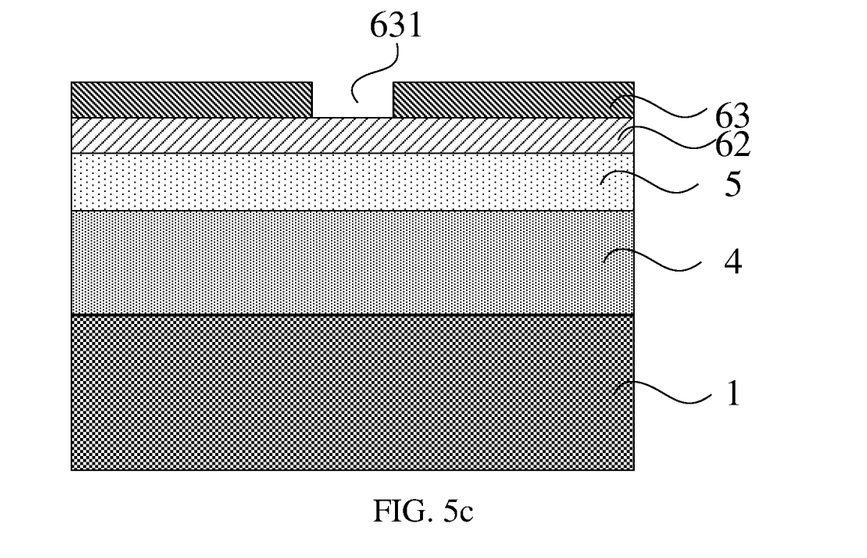

As shown in FIG. 5c, the mask layer 64 is removed before step S13.

Figure 5D:
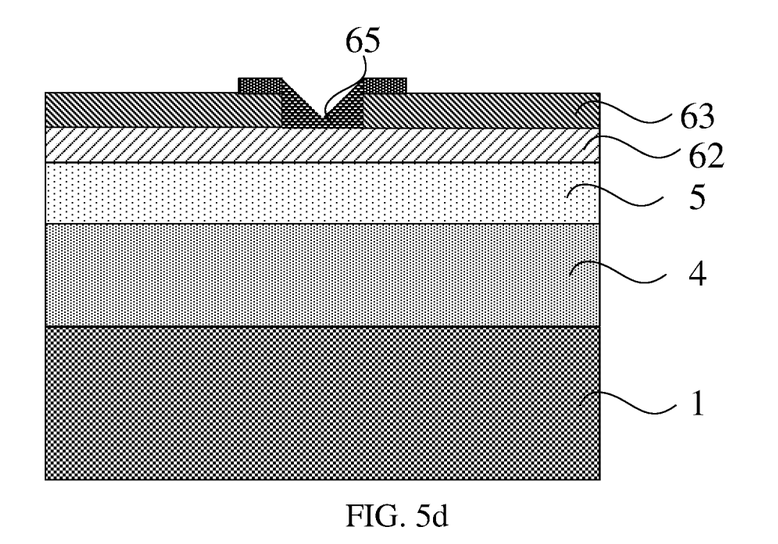
Figure 5E:
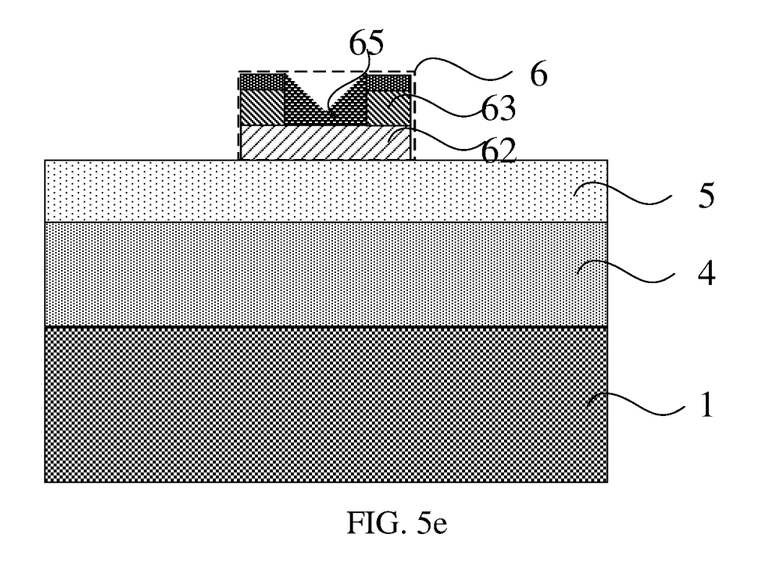

Other steps are the same as those in the second embodiment, as shown in FIG. 5d to FIG. 5e. In this embodiment, the mask layer 64 includes photoresist, $SiO_2$, SiN, and the like.

Further, the preparation method for a semiconductor structure further includes: forming a cap layer 61 between the p-type semiconductor layer 62 and the barrier layer 5. The gate structure 6 further includes the cap layer 61, and the cap layer 61 is made of a GaN-based material. The specific preparation process includes:

before growing the p-type semiconductor layer 62, forming the cap layer 61 on the barrier layer 5; and after forming a gate, etching the cap layer 61, the p-type semiconductor layer 62, and the n-type semiconductor layer 63 that are on two sides of the gate to form the gate structure 6.

Other steps are the same as those in the foregoing embodiment, and details are not repeated herein again.

Figure 6:
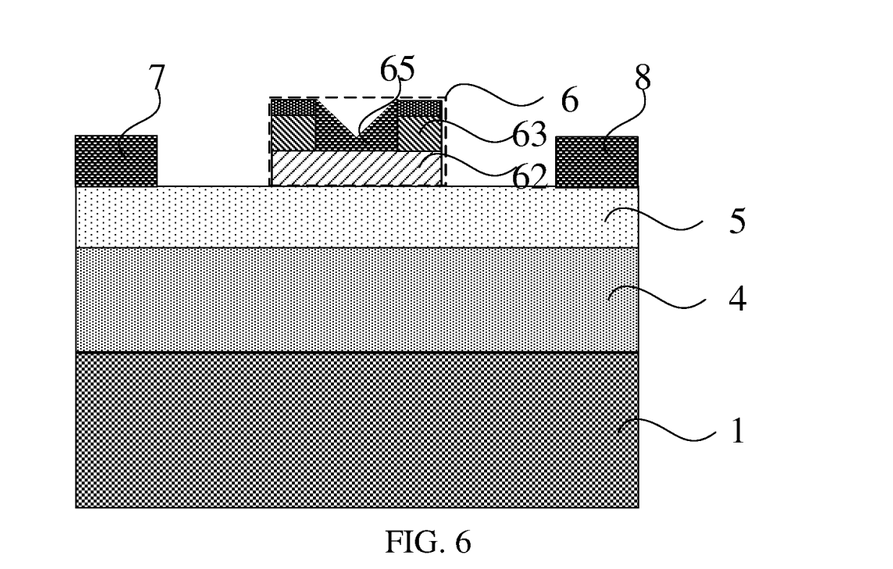

Further, the preparation method for a semiconductor structure further includes: after preparing the gate structure 6, forming a source 7 and a drain 8 on two sides of the gate structure 6, as shown in FIG. 6.

This application provides a semiconductor structure, as shown in FIG. 6, including:

a substrate 1;

a channel layer 4 and a barrier layer 5 sequentially disposed on the substrate 1; and a gate structure 6 disposed on the barrier layer 5, where the gate structure 6 includes a p-type semiconductor layer 62, an n-type semiconductor layer 63 and a gate 65, and the gate 65 penetrates the n-type semiconductor layer 63.

Further, the semiconductor structure further includes: a source 7 and a drain 8 respectively located on two sides of the gate structure 6.

Figure 7:
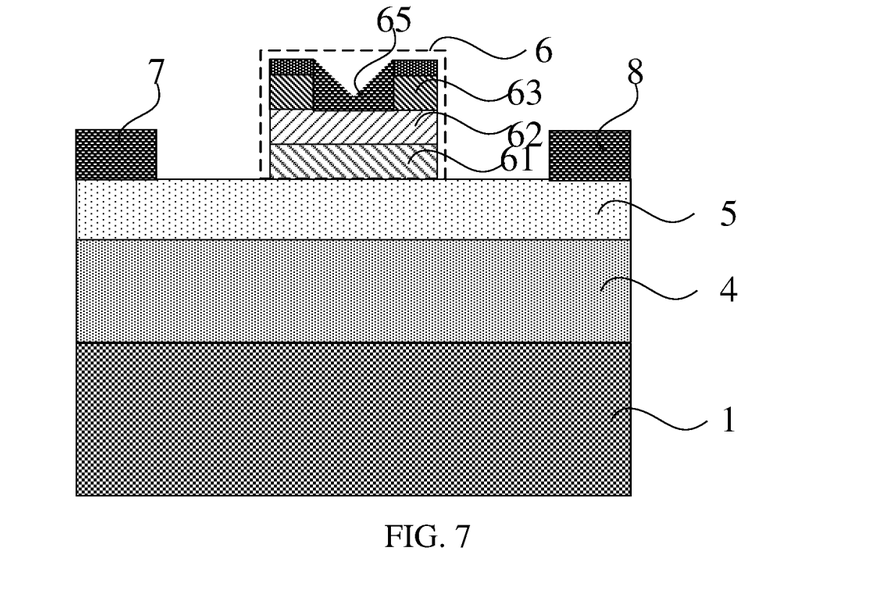
FIG. 7 shows a semiconductor structure according to another embodiment of the application.

Further, the semiconductor structure further includes: a cap layer 61 further formed between the p-type semiconductor layer 62 and the barrier layer 5, as shown in FIG. 7. The gate structure 6 includes a cap layer 61.

The cap layer 61 is made of a GaN-based material. In this embodiment, the cap layer 61 may be GaN. The GaN cap layer serves as a resist layer, which can prevent diffusion of impurities in the p-type semiconductor layer 62, avoiding channel degradation caused by the diffusion of impurities, and improving output characteristics of a device.

Figure 8:
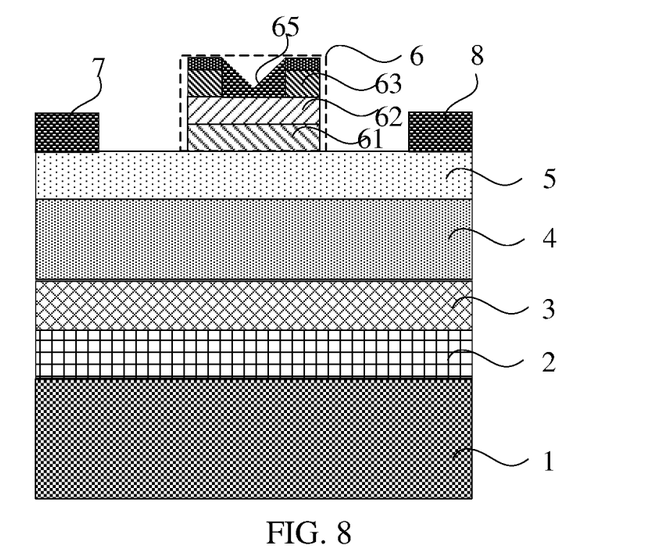
FIG. 8 shows a semiconductor structure according to another embodiment of the application.

Further, the semiconductor structure further includes: a nucleation layer 2 and a buffer layer 3 that are disposed between the substrate 1 and the channel layer 4, as shown in FIG. 8.

According to the semiconductor structure and the preparation method therefor in the application, a self-aligning process is adopted to improve a control capability of a gate to a channel. A p-type semiconductor and an n-type semiconductor are disposed in a gate area to increase a threshold voltage of the semiconductor device and avoid vertical electric leakage of a gate structure, and side electric leakage of the gate structure can also be reduced. In addition, according to the semiconductor structure and the preparation method therefor in the application, channel degradation is further avoided, and overall output characteristics of the device is improved.

It should also be note that, in the description of the application, unless expressly specified and defined otherwise, the terms "disposed", "mounted", "connected to each other", and "connected to" should be understood in a broad sense. For example, "connection" may be a fixed connection, a detachable connection, or an integral connection; or may be a mechanical connection, a connection, or a mutual communication; or may be a direct connection or an indirect connection by means of an intermediate medium; or may be an internal communication between two elements. For a person of ordinary skill in the art, specific meanings of the foregoing terms in the application may be understood based on specific situations.

It should be noted that similar reference signs and letters indicate similar items in the following drawings. Therefore, once a certain item is defined in one drawing, it does not need to be further defined and explained in the subsequent drawings.

In the description of the application, it should be noted that, orientations or position relationships indicated by the terms "center", "upper", "lower", "left", "right", "vertical", "horizontal", "inner", "outer", and the like are orientations or position relationships based on the accompanying drawings, or the orientations or position relationships that a product of the application usually placed when being used, which are merely intended to facilitate the description of the application and simplify the description, rather than indicating or implying that the referred device or element must have a particular orientation or be constructed and operated in a particular orientation. Therefore, these terms should not be interpreted as limiting the application. In addition, the terms "first", "second", "third" and the like are merely intended for a purpose of description and shall not be understood as an indication or implication of relative importance.

The foregoing descriptions are merely preferred embodiments of the application but are not intended to limit the application. For a person skilled in the art, various changes and variations can be made in the application. Any modification, equivalent alteration, improvement or the like within the spirit and principle of the invention shall fall into the protection scope of the invention.

What is claimed is:

1. A semiconductor structure, comprising:
   a substrate;
   a channel layer and a barrier layer sequentially disposed on the substrate; and
   a gate structure disposed on the barrier layer, wherein the gate structure comprises a p-type semiconductor layer disposed on the barrier layer, an n-type semiconductor layer disposed on the p-type semiconductor layer, a gate disposed on the n-type semiconductor layer, and a cap layer located between the p-type semiconductor layer and the barrier layer, the gate penetrates the n-type semiconductor layer, and a bottom of the gate is in contact with the p-type semiconductor layer; the semiconductor structure further comprises a source and a drain, wherein the source and the drain are respectively disposed on two sides of the gate structure; the cap layer is GaN; a side surface, facing the source, of the p-type semiconductor layer, a side surface, facing the source, of the n-type semiconductor layer, a side surface, facing the source, of the gate and a side surface, facing the source, of the cap layer are located in a same first plane, a side surface, facing the drain, of the p-type semiconductor layer, a side surface, facing the drain, of the n-type semiconductor layer, a side surface, facing the drain, of the gate and a side surface, facing the drain, of the cap layer are located in a same second plane, an entire top surfaces of the n-type semiconductor layer is covered by the gate, and an entire top surfaces of the p-type semiconductor layer is covered by the n-type semiconductor layer and the gate; the cap layer is completely covered by the p-type semiconductor layer, the n-type semiconductor layer and the gate; and there is a gap, between the first plane and a plane, facing the gate, of the source, exposing a part of a top surface of the barrier layer, and there is a gap, between the second plane and a plane, facing the gate, of the drain, exposing a part of the top surface of the barrier layer.

2. The semiconductor structure according to claim 1, further comprising a nucleation layer and a buffer layer, wherein the nucleation layer and the buffer layer are disposed between the substrate and the channel layer.

3. The semiconductor structure according to claim 1, wherein the channel layer and the barrier layer are made of a GaN-based material.

4. A preparation method for a semiconductor structure, comprising:
   providing a substrate;
   sequentially growing a channel layer and a barrier layer on the substrate in a superimposed manner;
   preparing a gate structure on the barrier layer, wherein the gate structure comprises a p-type semiconductor layer disposed on the barrier layer, an n-type semiconductor layer disposed on the p-type semiconductor layer, and a gate disposed on the n-type semiconductor layer, the gate penetrates the n-type semiconductor layer, a bottom of the gate is in contact with the p-type semiconductor layer, and the gate structure further comprises a cap layer located between the p-type semiconductor layer and the barrier layer, the cap layer is GaN; and
   preparing a source and a drain respectively on two sides of the gate structure,
   wherein a side surface, facing the source, of the p-type semiconductor layer, a side surface, facing the source, of the n-type semiconductor layer, a side surface, facing the source, of the gate and a side surface, facing the source, of the cap layer are located in a same first plane, a side surface, facing the drain, of the p-type semiconductor layer, a side surface, facing the drain, of the n-type semiconductor layer, a side surface, facing the drain, of the gate and a side surface, facing the drain, of the cap layer are located in a same second plane, an entire top surfaces of the n-type semiconductor layer is covered by the gate, and an entire top surfaces of the p-type semiconductor layer is covered by the n-type semiconductor layer and the gate; the cap layer is completely covered by the p-type semiconductor layer, the n-type semiconductor layer and the gate; and there is a gap, between the first plane and a plane, facing the gate, of the source, exposing a part of a top surface of the barrier layer, and there is a gap, between the second plane and a plane, facing the gate, of the drain, exposing a part of the top surface of the barrier layer.

5. The preparation method according to claim 4, wherein preparing the gate structure comprises:
   S1: growing the p-type semiconductor layer on the barrier layer;
   S2: epitaxially growing the n-type semiconductor layer selectively on the p-type semiconductor layer, so that a groove is reserved in the middle of the n-type semiconductor layer, and the groove penetrates the n-type semiconductor layer;
   S3: forming the gate in the groove; and
   S4: etching the p-type semiconductor layer and the n-type semiconductor layer that are on two sides of the gate to form the gate structure.

6. The preparation method according to claim 4, wherein preparing the gate structure comprises:
   S11: growing the p-type semiconductor layer and the n-type semiconductor layer on the barrier layer;
   S12: starting etching of a groove from one side of the n-type semiconductor layer away from the p-type semiconductor layer, wherein the groove completely penetrates the n-type semiconductor layer and stops at the p-type semiconductor layer;
   S13: forming the gate in the groove; and
   S14: etching the p-type semiconductor layer and the n-type semiconductor layer located on two sides of the gate to form the gate structure.

7. The preparation method according to claim 6, wherein preparing the gate structure further comprises:
   forming a mask layer on the n-type semiconductor layer before step S12;
   starting etching of a groove from one side of the mask layer away from the n-type semiconductor layer, wherein the groove completely penetrates the mask layer and the n-type semiconductor layer and stops at the p-type semiconductor layer; and
   removing the mask layer before step S13.

8. The preparation method according to claim 7, wherein the mask layer comprises one of photoresist, SiO$_2$ and SiN.

9. The preparation method according to claim 4, wherein preparing the gate structure comprises:
   S11: growing the p-type semiconductor layer and the n-type semiconductor layer on the barrier layer;
   S22: starting etching of a groove from one side of the n-type semiconductor layer away from the p-type semiconductor layer, wherein the groove completely penetrates the n-type semiconductor layer and partially penetrates the p-type semiconductor layer;
   S13: forming the gate in the groove; and
   S14: etching the p-type semiconductor layer and the n-type semiconductor layer located on two sides of the gate to form the gate structure.

10. The preparation method according to claim 9, wherein preparing the gate structure further comprises:
    forming a mask layer on the n-type semiconductor layer before step S22;
    starting etching of a groove from one side of the mask layer away from the n-type semiconductor layer, wherein the groove completely penetrates the mask layer and the n-type semiconductor layer and partially penetrates the p-type semiconductor layer; and
    removing the mask layer before step S13.

11. The preparation method according to claim 10, wherein the mask layer comprises one of photoresist, SiO$_2$ and SiN.

12. The preparation method according to claim 4, further comprising: forming a nucleation layer and a buffer layer between the substrate and the channel layer.

13. The preparation method according to claim 4, wherein the channel layer and the barrier layer are made of a GaN-based material.

14. A semiconductor structure, comprising:
    a substrate;
    a channel layer and a barrier layer sequentially disposed on the substrate; and
    a gate structure disposed on the barrier layer, wherein the gate structure comprises a p-type semiconductor layer disposed on the barrier layer, an n-type semiconductor layer disposed on the p-type semiconductor layer, a gate disposed on the n-type semiconductor layer, and a cap layer located between the p-type semiconductor layer and the barrier layer, the gate penetrates the n-type semiconductor layer, and a bottom of the gate is in contact with the p-type semiconductor layer; the semiconductor structure further comprises a source and a drain, wherein the source and the drain are respectively disposed on two sides of the gate structure; the cap layer is GaN; a side surface, facing the source, of the p-type semiconductor layer, a side surface, facing the source, of the n-type semiconductor layer, a side surface, facing the source, of the gate and a side surface, facing the source, of the cap layer are located in a same first plane, a side surface, facing the drain, of the p-type semiconductor layer, a side surface, facing the drain, of the n-type semiconductor layer, a side surface, facing the drain, of the gate and a side surface, facing the drain, of the cap layer are located in a same second plane, an entire top surfaces of the n-type semiconductor layer is covered by the gate, and an entire top surfaces of the p-type semiconductor layer is covered by the n-type semiconductor layer and the gate; the cap layer is completely covered by the p-type semiconductor layer, the n-type semiconductor layer and the gate; and there is a gap, between the first plane and a plane, facing the gate, of the source, exposing a part of a top surface of the barrier layer, and there is a gap, between the second plane and a plane, facing the gate, of the drain, exposing a part of the top surface of the barrier layer; and a side, facing away from the substrate, of the gate is provided with a groove.

* * * * *